United States Patent

Reich et al.

[11] 4,069,049
[45] Jan. 17, 1978

[54] PROCESS FOR RECORDING HOLOGRAPHIC INFORMATION

[75] Inventors: Shymon Reich; Albert A. Friesem, both of Rehovot, Israel

[73] Assignee: Yeda Research & Development Co., Ltd., Rehovot, Israel

[21] Appl. No.: 677,213

[22] Filed: Apr. 15, 1976

Related U.S. Application Data

[62] Division of Ser. No. 628,752, Nov. 4, 1975.

[30] Foreign Application Priority Data

Dec. 2, 1974 Israel ........................................ 46164

[51] Int. Cl.² .................................................. G03C 5/04
[52] U.S. Cl. ...................................... 96/27 H; 96/67; 350/3.5
[58] Field of Search .................. 96/27 R, 27 E, 27 H, 96/38.3, 67; 350/3.5

[56] References Cited

U.S. PATENT DOCUMENTS

| | | | |
|---|---|---|---|
| 3,568,597 | 3/1971 | Staehle | 96/33 |
| 3,658,526 | 4/1972 | Naugh | 96/27 H |
| 3,667,946 | 6/1972 | Sturdevant | 96/27 H |
| 3,669,673 | 6/1972 | Senih et al. | 96/27 H |
| 3,689,264 | 9/1972 | Chandross et al. | 96/27 H |
| 3,694,218 | 9/1972 | Margerum et al. | 96/27 H |
| 3,707,371 | 12/1972 | Files | 96/27 H |
| 3,926,637 | 12/1975 | Bartolini et al. | 96/27 H X |
| 3,951,663 | 4/1976 | Ross | 96/67 |

*Primary Examiner*—Edward C. Kimlin
*Attorney, Agent, or Firm*—Browdy and Neimark

[57] ABSTRACT

A method for recording spatially modulated optical data and for the recording of holographic information in real time, comprising preparing a photosensitive recording medium comprising a polymeric sheet containing a photosensitizer adapted to bring about a change of the refractive index of the polymer upon irradiation in the visible or in the UV range and recording the information by means of a holographic set-up.

10 Claims, 1 Drawing Figure

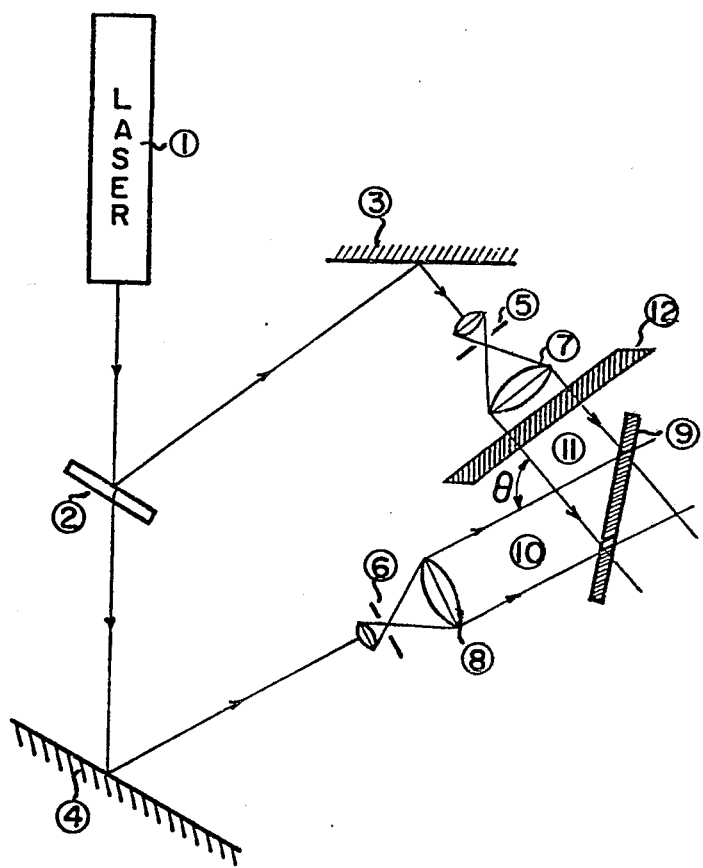

PROCESS FOR RECORDING HOLOGRAPHIC INFORMATION

This is a division, of application Ser. No. 628,752, filed Nov. 4, 1975.

FIELD OF THE INVENTION

The present invention is in the field of coherent optics and is specifically directed to phase storage materials for recording spatially modulated optical data and for recording holographic information. Unlike photographic emulsions which record holographic data as absorption fluctuations, phase materials record the data as index of refraction fluctuation, thereby increasing the diffraction efficiency of the hologram. In addition, the present invention deals with self-developing materials that need no wet chemical processing, obtaining the desired recording in virtually real time. Furthermore, the subject materials possess high resolution capabilities and exceptional storage capacity.

SUMMARY OF THE INVENTION

It is the objective of the present invention to provide a novel process for recording. It is a further object of the invention to provide a holographic system with almost instantaneous development which can be achieved without removing the recording material from the optical system.

The above objects may be accomplished in accordance with the present invention by recording a phase hologram on a polymeric material which will change its index of refraction when irradiated with actinic radiation. The changes of index of refraction correspond with the optical interference pattern to be recorded as the phase hologram. Altough the holographic technique is a preferred method for forming the interference pattern to be recorded in the polymeric material, any suitable optical system capable of yielding the phase hologram construction exposure is suitable - for example, the use of grating to modulate an optical transparency, or the modulation of a laser beam to introduce a carrier frequency.

BRIEF DESCRIPTION OF THE DRAWING

The drawing shows a schematical view, not according to scale, off a holographic recording arrangement of the invention.

DESCRIPTION OF THE DEVICE ACCORDING TO THE INVENTION

As shown in the drawing, light from a laser 1 (other coherent light sources are also suitable) is divided by a beamsplitter 2; one path constitutes the reference beam 10 and the other constitutes the signal beam 11. The mirrors 3 and 4 respectively, are used to reflect the said light beams so that they strike the recording material, 9. The pinhole assemblies 5 and 6, and the collimating lenses 7 and 8 are used to expand and collimate the laser beams. The light after lens 7 passes through the transparent object 12 and interferes with the reference beam 10 and the resulting interference patterns are recorded in the recording material 9. The spatial frequency of the interference fringes, determined by the angle, 0, is called the offset frequency of the hologram. Although a transparent object is shown, it is of course to be understood that an opaque three-dimensional object may be employed with the light reflected from it onto the recording materials.

The set-up shown in FIG. 1 can be used in a holographic document storage and retrieval system to record documents. The recording material would be partitioned for such application to many sub-areas, each comprising a hologram of a specific document. With proper apertures and indexing, the input transparent object (which is an optical transparency of a document) as well as the recording material, allows the recording of another hologram of a different document at an adjacent location on the recording material.

Alternatively, the set-up shown in FIG. 1 can be used to record complex filters by introducing a lens into the signal path, midway between the transparent object and the recording material — the distance from the lens to the hologram being the focal length of the lens. The advantage of using a polymeric material over conventional photographic emulsions in such a set-up is that the complex filters are generated in virtually real-time and can be immediately employed to process incoming data. For example, in real-time coherent radar processing, in real-time target recognition and in real-time image enhancement.

In the case of three-dimensional opaque objects, a modified set-up of FIG. 1 can be used for real-time in-situ holographic non-destructive testing.

The reconstructed image may be viewed immediately after recording, by blocking the signal beam and viewing the image through the recorded hologram. The image will coincide in position with the original object.

A unique feature of the invention is that the reconstructed image may be viewed while the hologram is being recorded, and the recording stopped at any desired instant. This is accomplished by recording the hologram with a blue line (488 nm) or green line (514.5 nm) from an argon laser, and reconstructing the hologram with the red line (632.8 nm) from a helium neon laser. With a suitable sensitizer, the polymeric mateial is not sensitive to red illumination, so that the recorded hologram may be safely viewed to obtain a red reconstructed image while simultaneously recording at a lower wave length.

the most widely described photosensitive system is polymethylmethacrylate (PMMA) sensitized by p-Benzoquinone (PBQ). This material is prepared by introducing PBQ into PMMA through a solvent such as chloroform, then a film is cast on a glass substrate and the solvent is evaporated.

We developed a new class of photosensitive materials by introducing PBQ and other sensitizers into 2-cyanoacrylate, $CH_2=C(CN)COOR$ monomers and then polymerizing the above solution as a film or sheet between two plates. The above procedure offers great advantages both in preparation and in characteristics of the new photosensitive materials (PSM). The uniqueness of these PSM follows from the very high reactivity of the 2-cyanoacrylate monomers which therefore can polymerize very rapidly even after the introduction of sensitizer like PBQ. The above sensitizer is in general a very powerful stabilizer and would in most cases prohibit polymerization to occur. The solubility of the above sensitizer in 2-cyanoacrylate monomers, and the rapid polymerization that can be induced in the above systems provide both new procedures and new materials in the domain of phase photosensitive materials.

DESCRIPTION OF THE PREFERRED EMBODIMENT

The invention is further described by way of example only in the following Examples:

EXAMPLE 1

A 10% by weight solution of PBQ in methy 2-cyanoacrylate was prepared and a few drops of the above solution were deposited on a microscope slide. This slide was then covered by another slide and the above solution was pressed between these bioslides for two minutes. This caused a rapid polymerization of the above monomeric solution to occur. A yellowish transparent polymer film of about 50 $\mu$ in thickness was obtained. The above film is photosensitive in the sense that its index of refraction is changed by impinging light on it in the spectral range 380–550 nm. In particular the following experiment was performed. A simple holographic grating was photoinduced in the above film using the 488 nm line from an argon laser at an offset angle of $\theta = 30°$. The experimental set-up was similar to that shown in FIG. 1.

The grating induced in this manner in the photopolymer had a diffraction efficiency of 50% for an exposure sensitivity of 3 Joules/cm$^2$. The offset angle $\theta$ was then increased to 120° and a new holographic recording was made. The diffraction was comparable to that at lower angles indicating that the resolution of the PSM exceeds 3000 lines/mm. Holographic grating was also induced in the photopolymer at 514.5 nm.

EXAMPLE 2

A 10% by weight solution of PBQ in ethyl 2-cyanoacrylate was prepared and polymerized in the manner described in Example 1. The material is photosensitive in the range of 380–550 nm. Holographic grating was photoinduced in this material by the procedure described in Example 1.

EXAMPLE 3

A 0.6% by weight solution of PBQ in methyl 2-cyanoacrylate was prepared and polymerized using the procedure of Example 1. The material is photosensitive in the sense of Example 1.

EXAMPLE 4

A 20% by weight solution of PBQ in methyl 2-cyanoacrylate was prepared and polymerized using the procedure of Example 1. The material was tested for photosensitivity and was found to be photosensitive in the sense of Example 1.

EXAMPLE 5

A 0.6% by weight solution of PBQ in ethyl 2-cyanoacrylate monomer was prepared and polymerized using the procedure of Example 1. The material wa tested for photosensitivity and was found to be photosensitive in the sense of Example 1.

EXAMPLE 6

A 20% by weight solution of PBQ in ethyl 2-cyanoacrylate monomer was prepared and polymerized using the procedure of Example 1. The material was tested for photosensitivity and was found to be photosensitive in the sense of Example 1.

EXAMPLE 7

Photosensitive polymers were prepared using PBQ as a sensitizer and a solvent comprising of 50% by volume solution of methyl 2-cyanoacrylate in ethyl 2-cyanoacrylate. The polymerization procedure and amount of PBQ were the same as in Example 1.

We claim:

1. A process for recording spatially modulated data and for the recording of holographic information in situ and in real time by means of a device adapted to record a hologram on a recording medium, comprising means for effecting an exposure of said recording medium with an information beam from an object illuminated with spatially coherent electromagnetic waves and means for simultaneously exposing said recording medium to a reference beam of said spatially coherent electromagnetic waves to produce on said recording medium a hologram interference pattern between said information beam and said reference beam, said recording medium consisting of a polymeric layer of from some microns thickness to a few millimeters thickness of a lower-alkyl 2-cyanoacrylate containing p-benzoquinone as photosensitizer, said process comprising:

exposing said recording medium with an information beam from an object illuminated with spatially coherent electromagnetic waves; and simultaneously exposing said recording medium to a reference beam of said spatially coherent electromagnetic waves to produce on said recording medium a hologram interference pattern between said information beam and said reference beam.

2. A process of recording according to claim 1, wherein said device includes a lens positioned between the object, which is a photographic transparency, and the said recording medium, the distance between the lens and the recording medium being that of the focal length of said lens, the distance of the object to the lens also being equal to the focal length of said lens.

3. A process according to claim 1, wherein the device includes a lens which is in such position that the object is between the lens and the recording medium so that converging waves from the lens are modulated by the object and converge to a focus located in the plane of the recording medium, said beam interfering in said plane with the waves of the said reference beam to form a complex optical filter comprising both amplitude and phase information of the Fourier transform of the object.

4. A process according to claim 1 for the recording of an archive record, said record consisting of at least one holographic interference fringe patterns forming at least one micro-hologram composed of a particular type of interference fringe pattern resulting from interference between the information monochromatic light flux obtained from the object which is of substantially larger size than the size of the microhologram, and a coherent reference beam to said object beam.

5. A process according to claim 1, wherein a hologram is recorded of a static object, said object is subjected to a predetermined stress and waves from said object subjected to the stress are made to interfere with the reconstructed image of the said object in its static state, providing means for the real-time holographic non-destructive testing of said object.

6. A process in accordance with claim 1, wherein said cyanocrylate is methyl- or ethyl-2-cyanoacrylate polymer or a mixture of these.

7. An apparatus for recording spatially modulated data and for the recording of holographic information in situ and in real time, comprising:
a recording medium;
information beam exposure means for effecting an exposure of said recording medium with an information beam from an object illuminated with spatially coherent electromagnetic waves; and
reference beam exposure means for simultaneously exposing said recording medium to a reference beam of said spatially coherent electromagnetic waves to produce on said recording medium a hologram interference pattern between said information beam and said reference beam;
said recording medium consisting of a polymeric layer of from some microns thickness to a few millimeters of a lower-alkyl 2-cyanoacrylate containing p-benzoquinone as photosensitizer.

8. An apparatus in accordance with claim 7, including a lens positioned between the object, which is a photographic transparency, and the said recording medium, the distance between the lens and the recording medium being that of the focal length of said lens, the distance of the object to the lens also being equal to the focal length of said lens.

9. An apparatus in accordance with claim 7, including a lens which is in such position that the object is between the lens and the recording medium, so that converging waves from the lens are modulated by the object and converge to a focus located in the plane of the recording medium, said beam interfering in said plane with the waves of the said reference beam to form a complex optical filter comprising both amplitude and phase information of the fourier transform of the object.

10. An apparatus in accordance with claim 7, wherein said cyanoacrylate is methyl- or ethyl-2-cyanoacrylate polymer or a mixture of these.

* * * * *

UNITED STATES PATENT AND TRADEMARK OFFICE
CERTIFICATE OF CORRECTION

PATENT NO. : 4,069,049
DATED : January 17, 1978
INVENTOR(S) : REICH et al

It is certified that error appears in the above-identified patent and that said Letters Patent are hereby corrected as shown below:

Column 1, line 47, "off" should read --of--

Column 1, line 65, "O" should read --Θ--

Signed and Sealed this

Eleventh Day of July 1978

[SEAL]

Attest:

RUTH C. MASON
Attesting Officer

DONALD W. BANNER
Commissioner of Patents and Trademarks